United States Patent
Jung et al.

(10) Patent No.: US 9,800,271 B2
(45) Date of Patent: Oct. 24, 2017

(54) ERROR CORRECTION AND DECODING

(71) Applicants: QUALCOMM Incorporated, San Diego, CA (US); Industry-Academic Cooperation Foundation, Yonsei University, Seoul (KR)

(72) Inventors: Seong-Ook Jung, Seoul (KR); Sara Choi, Seoul (KR); Byung Kyu Song, Seoul (KR); Taehui Na, Seoul (KR); Jisu Kim, Seoul (KR); Jung Pill Kim, San Diego, CA (US); Sungryul Kim, San Diego, CA (US); Taehyun Kim, Cupertino, CA (US); Seung Hyuk Kang, San Diego, CA (US)

(73) Assignees: QUALCOMM Incorporated, San Diego, CA (US); Industry-Academic Cooperation Foundation, Yonsei University, Seoul (KR)

( * ) Notice: Subject to any disclaimer, the term of this patent is extended or adjusted under 35 U.S.C. 154(b) by 89 days.

(21) Appl. No.: 14/852,988

(22) Filed: Sep. 14, 2015

(65) Prior Publication Data
US 2017/0077963 A1    Mar. 16, 2017

(51) Int. Cl.
H03M 13/00 (2006.01)
G06F 11/10 (2006.01)
H03M 13/15 (2006.01)

(52) U.S. Cl.
CPC ......... H03M 13/616 (2013.01); G06F 11/10 (2013.01); H03M 13/152 (2013.01); H03M 13/1575 (2013.01); H03M 13/617 (2013.01); H03M 13/6502 (2013.01)

(58) Field of Classification Search
CPC .................. H03M 13/616; H03M 13/617
See application file for complete search history.

(56) References Cited

U.S. PATENT DOCUMENTS

| | | | |
|---|---|---|---|
| 3,650,107 A * | 3/1972 | Court ................ | F16H 61/42 60/443 |
| 4,030,067 A | 6/1977 | Howell et al. | |
| 4,556,977 A | 12/1985 | Olderdissen et al. | |
| 4,979,174 A * | 12/1990 | Cheng ................ | H04L 1/004 714/774 |
| 5,469,450 A * | 11/1995 | Cho ................ | G06F 11/1076 714/718 |

(Continued)

FOREIGN PATENT DOCUMENTS

EP    1612949 B1    4/2010

OTHER PUBLICATIONS

International Search Report and Written Opinion—PCT/US2016/048604—ISA/EPO—Nov. 18, 2016.

(Continued)

Primary Examiner — Esaw Abraham
(74) Attorney, Agent, or Firm — Muncy, Geissler, Olds & Lowe, PC/QUALCOMM

(57) ABSTRACT

Error detection and correction decoding apparatus performs single error correction-double error detection (SEC-DED) or double error correction-triple error detection (DEC-TED) depending on whether the data input contains a single-bit error or a multiple-bit error, to reduce power consumption and latency in case of single-bit errors and to provide powerful error correction in case of multiple-bit errors.

27 Claims, 6 Drawing Sheets

(56) References Cited

U.S. PATENT DOCUMENTS

| | | | |
|---|---|---|---|
| 5,535,227 A | 7/1996 | Silvano | |
| 7,200,780 B2* | 4/2007 | Kushida | G06F 11/1008 365/201 |
| 7,353,438 B2* | 4/2008 | Leung | G06F 11/1048 714/720 |
| 7,502,986 B2* | 3/2009 | O'Neill | G06F 11/10 714/769 |
| 7,634,709 B2 | 12/2009 | Bauman et al. | |
| 7,768,828 B2* | 8/2010 | Lee | G11C 11/5621 365/185.03 |
| 8,214,725 B2* | 7/2012 | Sugahara | G06F 11/1068 714/764 |
| 8,261,165 B2 | 9/2012 | Mutchnik et al. | |
| 8,381,083 B2* | 2/2013 | Wezelenburg | G06F 11/1048 714/777 |
| 8,694,862 B2* | 4/2014 | Sazeides | G06F 11/1008 714/703 |
| 8,745,472 B2 | 6/2014 | Goel et al. | |
| 8,762,821 B2* | 6/2014 | Wu | G06F 11/1064 714/769 |
| 9,246,516 B2* | 1/2016 | Kwok | H03M 13/1515 |
| 2013/0086444 A1 | 4/2013 | Liu | |

OTHER PUBLICATIONS

Okano I., et al., "A Construction Method of High-Speed Decoders Using ROM's for Bose-Chaudhuri-Hocquenghem and Reed-Solomon Codes", IEEE Transactions on Computers, IEEE Service Center, Los Alamitos, CA, US, vol. C-34, No. 10, Oct. 1, 1987 (Oct. 1, 1987), XP011291237, pp. 1165-1171, ISSN: 0018-9340.

Yamagishi A., et al., "A Construction Method for Decoders of BCH Codes Using ROM's", Systems, Computers, Controls, Scripta Publishing Company, Washington, US, Nov. 1, 1980 (Nov. 1, 1980), XP000648455, vol. 11, No. 6, pp. 58-67.

* cited by examiner

ERROR CORRECTION AND DECODING

FIELD OF DISCLOSURE

Various embodiments described herein relate to error correction, and more particularly, to single-bit and multiple-bit error correction.

BACKGROUND

Various schemes have been devised for error detection and correction in digital apparatus and devices such as memories. In the realm of error correction in memory devices, error detecting and error correcting may be performed separately. For example, schemes such as single error correcting-double error detecting (SEC-DED) have been devised which would allow for the correction of a single-bit error if a double-bit error is detected. In case of multiple-bit errors, however, conventional SEC-DED schemes may not be sufficiently powerful to mitigate these errors.

More powerful error detecting and correcting schemes have been devised to address the problem of multiple-bit errors. For example, schemes such as double error correcting-triple error detecting (DEC-TED) have been devised which would provide more powerful error correcting capabilities than conventional SEC-DED schemes. The area of circuitry typically required for DEC-TED, however, would be much larger than the area required for SEC-DED. Moreover, conventional DEC-TED circuitry typically consumes more power and results in longer latency or time delay than conventional SEC-DED circuitry. For example, when DEC-TED circuitry is utilized to correct a single error, power consumption and time delay would be much greater than SEC-DED circuitry.

Furthermore, pure combinational circuits implementing error correcting codes for single- or multiple-bit error correction may typically consume large amounts of dynamic power when the input changes due to invalid transitions in error location decoding. It would be desirable to reduce the amount of power consumption required for error detection and correction, especially for multiple-bit error detection and correction in low-power integrated circuit devices such as low-power memory chips.

SUMMARY

Exemplary embodiments of the disclosure are directed to apparatus and methods of double error correction in memories with reduced power consumption.

In an embodiment, an error detection and correction apparatus is provided, the error detection and correction apparatus comprising: a single error location decoder configured to locate single errors in input data; a double error location decoder configured to locate double errors in the input data; and an error corrector coupled to the single error location decoder and the double error location decoder to generate corrected output data.

In another embodiment, an error detection and correction apparatus is provided, the error detection and correction apparatus comprising: means for single error location decoding to locate single errors in input data; means for double error location decoding to locate double errors in the input data; and means for correcting errors to generate corrected output data based on the single errors and the double errors.

In another embodiment, an error detection and correction apparatus is provided, the error detection and correction apparatus comprising: logic configured to locate single errors in input data; logic configured to locate double errors in the input data; and logic configured to generate corrected output data based on the single errors and the double errors.

In yet another embodiment, a memory is provided, the memory comprising: a memory cell; and an error detection and correction apparatus coupled to receive input data from the memory cell and to transmit corrected output data to the memory cell, the error detection and correction apparatus comprising: a single error location decoder configured to locate single errors in input data; a double error location decoder configured to locate double errors in the input data; and an error corrector coupled to the single error location decoder and the double error location decoder to generate corrected output data.

BRIEF DESCRIPTION OF THE DRAWINGS

The accompanying drawings are presented to aid in the description of embodiments of the disclosure and are provided solely for illustration of the embodiments and not limitation thereof.

DETAILED DESCRIPTION

Figure 1:
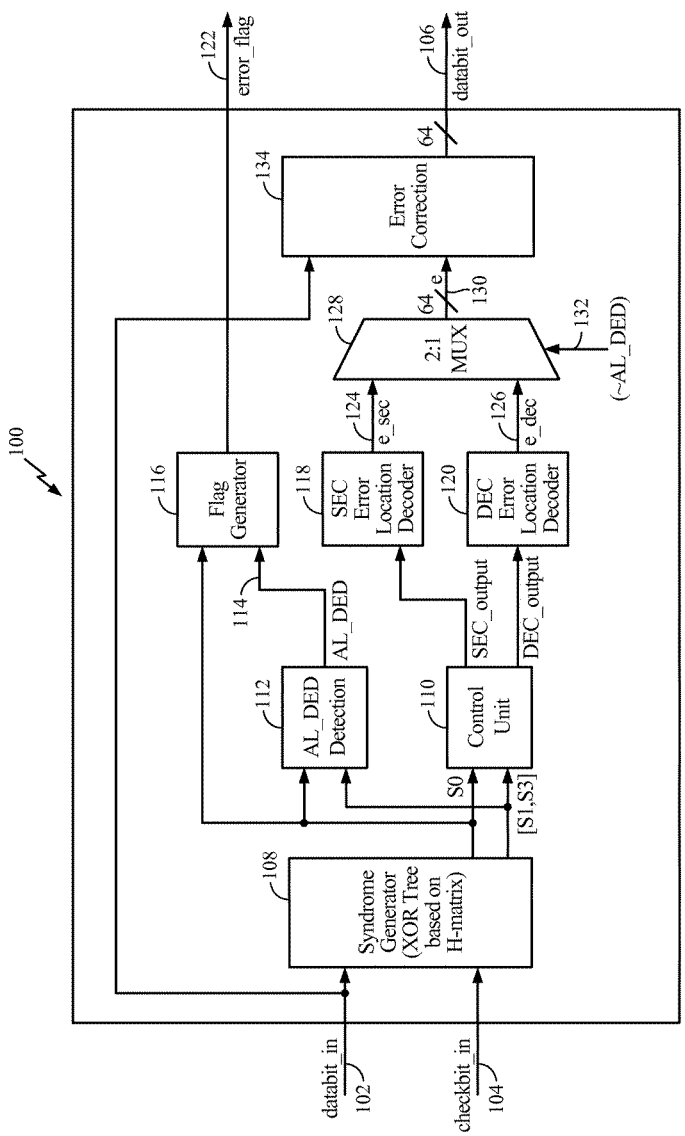
FIG. 1 is a block diagram illustrating an embodiment of an error detection and correction apparatus.

Aspects of the disclosure are described in the following description and related drawings directed to specific embodiments. Alternate embodiments may be devised without departing from the scope of the disclosure. Additionally, well-known elements will not be described in detail or will be omitted so as not to obscure the relevant details of the disclosure.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of the embodiments. As used herein, the singular forms "a," "an" and "the" are intended to include the plural forms as well, unless the context clearly indicates otherwise. It will be further understood that the terms "comprises," "comprising," "includes" or "including," when used herein, specify the presence of stated features, integers, steps, operations, elements, and/or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Further, many embodiments are described in terms of sequences of actions to be performed by, for example, elements of a computing device. It will be recognized that various actions described herein can be performed by specific circuits, for example, central processing units (CPUs), graphic processing units (GPUs), digital signal processors (DSPs), application specific integrated circuits (ASICs), field programmable gate arrays (FPGAs), or various other types of general purpose or special purpose processors or circuits, by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

FIG. 1 is a block diagram illustrating an embodiment of an error detection and correction apparatus 100 having a data input (databit_in) 102, an error check input (checkbit_in) 104, and a corrected data output (databit_out) 106. Such an error correcting code decoder may be implemented in various digital apparatus or devices for correcting data errors, for example, in memory devices such as spin-transfer torque magnetic random access memories (STT-MRAMs). It will be appreciated that the error correcting code decoder according to embodiments of the disclosure may also be used in various other apparatus or devices by persons skilled in the art. Referring to FIG. 1, the error detection and correction apparatus 100 includes a syndrome generator 108 which is configured to receive the data input (databit_in) 102 and the error check input (checkbit_in) 104. In an embodiment, the syndrome generator 108 is capable of generating a first vector signal output ($S_0$), a second vector signal output ($S_1$) and a third vector signal output ($S_3$) in response to the data input (databit_in) 102 and the error check input (checkbit_in) 104.

In an embodiment, the syndrome generator 108 comprises a parity-check matrix decoder, and the error check input (checkbit_in) 104 comprises a parity-check bit input. Such a syndrome generator 108 may be constructed by using one of many known error correcting codes (ECCs). In an embodiment, the parity-check matrix decoder may comprise an XOR-tree based parity-check matrix decoder. For example, the syndrome generator 108 may be constructed by implementing an ECC such as a double error correcting-triple error detecting (DEC-TED) Bose-Chaudhuri-Hocquenghem (BCH) code where a is a primitive element in the Galois field $GF(2^n)$:

$$H = \begin{bmatrix} 1 & 1 & 1 & \ldots & 1 \\ 1 & \alpha & \alpha^2 & \ldots & \alpha^{n-1} \\ 1 & \alpha^3 & \alpha^6 & \ldots & \alpha^{3(n-1)} \end{bmatrix} = \begin{bmatrix} 1 \\ H_1 \\ H_3 \end{bmatrix}$$

The syndrome generated by the above parity check matrix may be divided into three parts, $$S = v \cdot H^T = [v \cdot 1, v \cdot H_1^T, v \cdot H_3^T] = [S_0, S_1, S_3]$$

In alternate embodiments, other types of syndrome generators may also be implemented for error detection and correction.

In the embodiment illustrated in FIG. 1, the error detection and correction apparatus 100 also includes a controller 110 which is configured to receive the first vector signal output ($S_0$), the second vector signal output ($S_1$) and the third vector signal output ($S_3$) from the syndrome generator 108, and to generate a single error correction output (SEC_output) and a double error correction output (DEC_output) based on at least two of the three vector signals $S_0$, $S_1$ and $S_3$ from the syndrome generator 108.

In an embodiment, the controller 110 is implemented to generate the single error correction output (SEC_output) and the double error correction output (DEC_output), which are transmitted to the inputs of a single error correction (SEC) error location decoder 118 and a double error correction (DEC) error location decoder 120, respectively. The SEC error location decoder 118 and the DEC error location decoder 120 will be described in further detail below. In an embodiment, it is desirable to reduce the delay and dynamic power consumption of the error detection and correction apparatus 100 by not having both the SEC error location decoder 118 and the DEC error location decoder 120 actively operating at the same time. For example, if the error in the data input is a single error, then the DEC error location decoder 120 should not be active. Likewise, if the error is a double error, then the SEC error location decoder 118 should not be active.

In an embodiment, the single error correction output (SEC_output) and the double error correction output (DEC_output) of the controller 110 are set to satisfy the above conditions. For example, if the first vector signal output ($S_0$) from the syndrome generator 108 is one, which means that the data input is assumed to have a single error, then the double error correction output (DEC_output) of the controller 110 is a zero vector. In contrast, if the first vector signal output ($S_0$) from the syndrome generator 108 is zero, which means that the data input is assumed to have a double error, then the single error correction output (SEC_output) of the controller is a zero vector.

In an embodiment, the outputs SEC_output and DEC_output of the controller 110 may be generated by the following equations based on the first vector signal output ($S_0$), the second vector signal output ($S_1$) and the third vector signal output ($S_3$) from the syndrome generator 108:

SEC_output=$S_0$*[$S_1,S_3$]

DEC_output=(~$S_0$)*[$S_1,S_3$]

where "~" denotes the logical complement or "NOT." For the triple error case, $S_0$ is one, which is the same as the single error case.

In the embodiment illustrated in FIG. 1, the error detection and correction apparatus 100 further includes a double error detector 112 which has inputs coupled to receive the first vector signal output ($S_0$), the second vector signal output ($S_1$) and the third vector signal output ($S_3$) from the syndrome generator 108, and an output that generates a double error detection output (AL_DED) 114 based on the three vector signals $S_0$, $S_1$ and $S_3$ received from the syndrome generator 108.

In an embodiment, the double error detection output (AL_DED) 114 from the double error detector 112 may be generated by the following equation based on the second vector signal output ($S_1$) and the third vector signal output ($S_3$) from the syndrome generator 108:

$$AL\_DED = S_1^3 + S_3$$

In a further embodiment, a flag generator 116 is provided in the error detection and correction apparatus 100 as illustrated in FIG. 1. In an embodiment, the flag generator 116 is provided to determine the number of errors from zero error to triple error. In an embodiment, the flag generator 116 generates a two-bit variable called an error flag (error_flag) 122, which is output from the error detection and correction apparatus 100 as a two-bit indicator of zero error, single error, double error or triple error.

In an embodiment, the error flag (error_flag) 122 may be determined based on the double error detection output (AL_DED) 114 from the double error detector 112 and the first vector signal output ($S_0$) from the syndrome generator 108:

TABLE 1

| Number of Errors | $S_0$ | Relationship between $S_0$, $S_1$ and $S_3$ | AL_DED | error_flag |
|---|---|---|---|---|
| No Error | 0 | $S_1 = S_3 = 0$ | 0 | 00 |
| Single Error | 1 | $S_1^3 = S_3$ | 0 | 01 |
| Double Error | 0 | $S_1^3 \neq S_3$ | 1 | 10 |
| Triple Error | 1 | $S_1^3 \neq S_3$ | 1 | 11 |

According to the table above, the relationship between the error_flag and $S_0$ can be expressed as follows:

Most significant bit (MSB) of error_flag=AL_DED
Least significant bit (LSB) of error_flag=$S_0$ As described above, the SEC error location decoder 118 is provided to locate single errors and the DEC error location decoder 120 is provided to locate double errors. In an embodiment, the SEC error location decoder 118 is coupled to receive the single error correction output (SEC_output) from the controller 110 and outputs a single error location decoder output (e_sec) 124 based on the SEC_output from the controller 110. In an embodiment, the DEC error location decoder 120 is coupled to receive the double error correction output (DEC_output) from the controller 110 and outputs a double error location decoder output (e_dec) 126 based on the DEC_output from the controller 110.

In an embodiment, a multiplexer 128 is provided in the error detection and correction apparatus 100 to generate a multiplexer output 130. In the embodiment illustrated in FIG. 1, the multiplexer 128 comprises a 2:1 multiplexer having a first input coupled to the single error location decoder output (e_sec) 124, a second input coupled to the double error location decoder output (e_dec) 126, and a multiplexer output 130 to output either the single error location decoder output (e_sec) or the double error location decoder output (e_dec) based on a control input 132.

In the embodiment illustrated in FIG. 1, the control input 132 for the multiplexer 128 is an input that receives the logical complement of the double error detection output (AL_DED) from the double error detector 112. In an embodiment, the control signal, which is (~AL_DED), at the control input 132 of the multiplexer 128 determines the output 130 of the multiplexer 128 according to the following relationships:

TABLE 2

| Control Signal (~AL_DED) | Output of Multiplexer |
|---|---|
| 0 | Output of DEC Error Location Decoder e_dec |
| 1 | Output of SEC Error Location Decoder e_sec |

In this embodiment, bit errors up to double errors in the data input may be corrected. Although triple errors may not be correctable in this embodiment, an error flag 122 generated by the flag generator 116 may indicate the presence of a triple error. For example, in the embodiment described with respect to Table 1 above, a two-bit error flag of 11 indicates the presence of a triple error.

In the embodiment described above, the relationships between the number of errors, the first vector signal output ($S_0$) from the syndrome generator 108, the output (e_sec) 124 from the SEC error location decoder 118, the output (e_dec) 126 from the DEC error location decoder 120, the logical complement of AL_DED (~AL_DED), and the output (e) 130 of the multiplexer 128 are summarized in the following table:

TABLE 3

| Number of Errors | $S_0$ | e_sec | e_dec | ~AL_DED | Multiplexer Output |
|---|---|---|---|---|---|
| No Error | 0 | zero vector | zero vector | 1 | e_sec = zero vector |
| Single Error | 1 | correct error vector for single error | zero vector | 1 | e_sec = correct error vector for single error |
| Double Error | 0 | zero vector | correct error vector for double error | 0 | e_dec = correct error vector for double error |
| Triple Error | 1 | incorrect error vector for triple error | zero vector | 0 | e_dec = zero vector |

In a further embodiment, an error corrector 134 is provided which has a data input coupled to receive the input data (databit_in), an error vector input coupled to the error vector output (e) 130 of the multiplexer 128, and an output 106 which outputs corrected data (databit_out).

Figure 2:
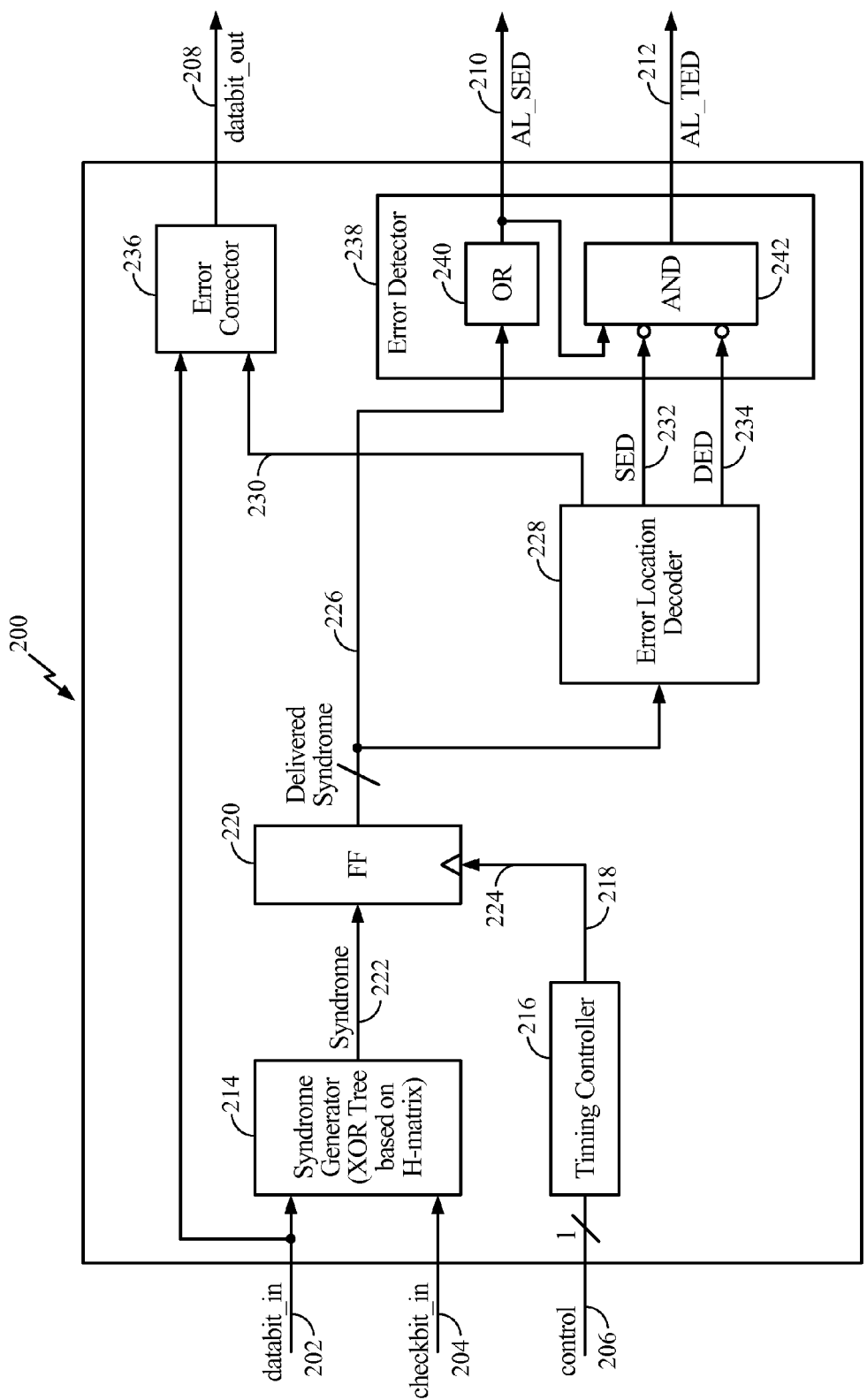
FIG. 2 is a block diagram illustrating another embodiment of an error detection and correction apparatus having a flip-flop and a timing controller.

FIG. 2 is a block diagram illustrating another embodiment of an error detection and correction apparatus 200 which includes a flip-flop and a timing controller but not separate SEC and DEC error location decoders with a multiplexer. In FIG. 2, the error detection and correction apparatus 200 has a data input (databit_in) 202, an error check input (checkbit_in) 204, a control input 206, a corrected data output (databit_out) 208, a single error detection output (AL_SED) 210 and a triple error detection output (AL_TED) 212. In the embodiment illustrated in FIG. 2, the error detection and correction apparatus 200 includes a syndrome generator 214. In an embodiment, the syndrome generator 214 in FIG. 2 may be similar to the syndrome generator 108 as shown in FIG. 1 and described above. For example, the syndrome generator 214 in FIG. 2 may comprise a parity-check matrix decoder, such as an XOR-tree based parity-check matrix decoder using a BCH code, as described above with respect to the embodiment shown in FIG. 1.

In the embodiment illustrated in FIG. 2, a timing controller 216 is provided. In an embodiment, the timing controller 216 includes a delay line, an embodiment of which will be described in further detail below with reference to FIG. 3. Referring to FIG. 2, the timing controller 216 is coupled to the control input 206 and delays the incoming signal from the control input 206 by a given amount of time before the incoming signal exits the timing controller 216 at a control output 218. In an embodiment, the error detection and correction apparatus 200 includes a flip-flop 220 having a data input 222 coupled to the output of the syndrome generator 214, a toggle input 224 coupled to the control output 218 of the timing controller 216, and an output which outputs a delivered syndrome output 226 based on the syndrome received from the syndrome generator 214 and the control output 218 of the timing controller 216.

In an embodiment, an error location decoder 228 is provided in the error detection and correction apparatus 200. In an embodiment, the error location decoder 228 has an input coupled to receive the delivered syndrome output 226 from the flip-flop 220, an error location decoder output 230, a single error decoder output (SED) 232 and a double error decoder output (DED) 234. In the embodiment shown in FIG. 2, an error corrector 236 is provided in the error detection and correction apparatus 200. In an embodiment, the error corrector 236 has a first input coupled to the data input (databit_in) 202, a second input coupled to the error location decoder output 230, and an output which generates the corrected data output (databit_out) 208 of the error detection and correction apparatus 200.

In an embodiment, the error detection and correction apparatus 200 also includes an error detector 238 which generates a single error detection output (AL_SED) 210 and a triple error detection output (AL_TED) 212. In an embodiment, the error detector 238 has a first input coupled to receive the delivered syndrome output 226 from the flip-flop 220, a second input coupled to receive the single error decoder output (SED) 232, and a third input coupled to receive the double error decoder output (DED) 234 from the error location decoder 228.

In an embodiment, the error detector 238 includes an OR gate 240 having an input coupled to receive the delivered syndrome output 226 and an output configured to output the single error detection output (AL_SED) 210. In a further embodiment, the error detector 238 also includes an AND gate 242 having a first input coupled to the output of the OR gate 240, a second input coupled to the complement of the single error decoder output (SED) 232, and a third output coupled to the complement of the double error decoder output (DED) 234. In the embodiment shown in FIG. 2, the output of the AND gate 242 is the triple error detection output (AL_TED) 212.

Figure 3:
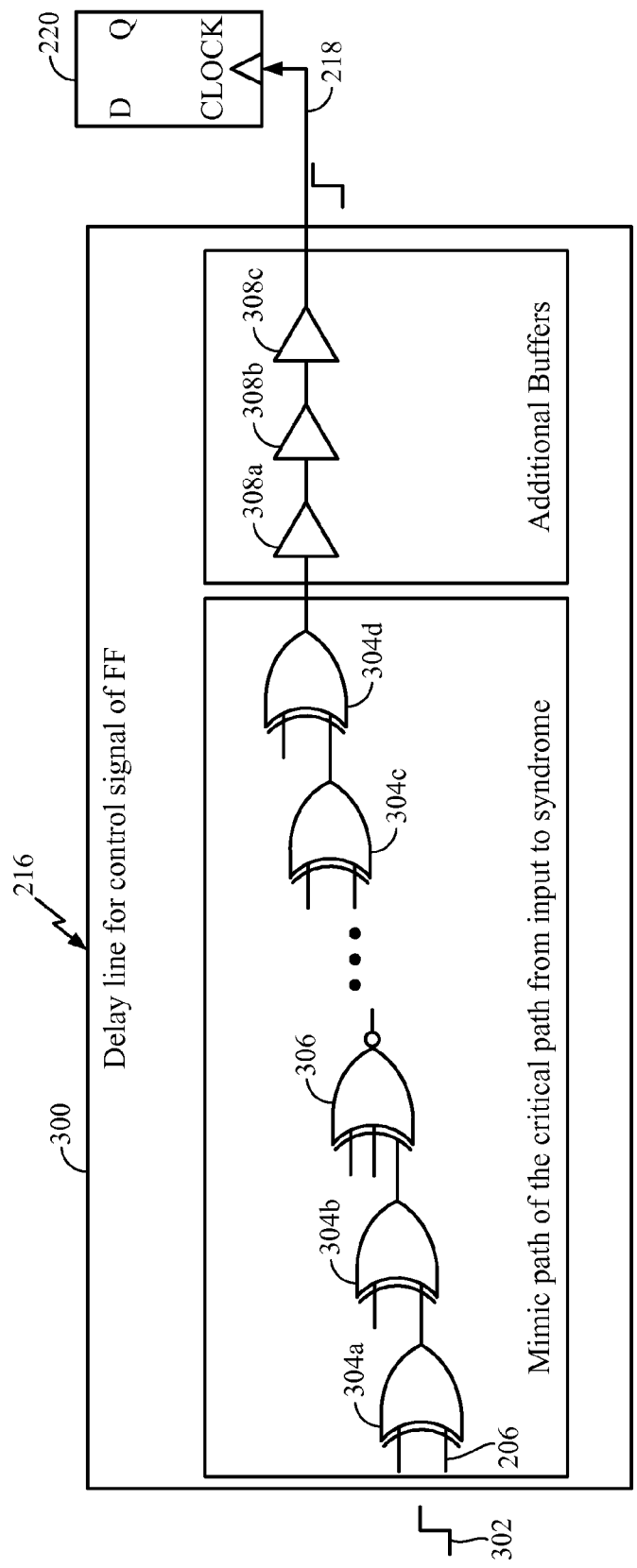
FIG. 3 is a block diagram illustrating an embodiment of a delay line as a timing controller in the embodiment of the error correcting and decoding apparatus of FIG. 2.

FIG. 3 is a block diagram illustrating an embodiment of the timing controller 216 which comprises a delay line 300 to generate a control signal for the flip-flop 220 in the embodiment of the error detection and correction apparatus of FIG. 2. In an embodiment, the control input 206 receives a clock signal 302 having a positive leading edge, and the positive leading edge of the clock signal 302 is delayed by a given amount of time when the clock signal 302 exits the output 218 of the delay line 300.

In an embodiment, a plurality of logic gates or buffers may be provided in the delay line 300 to delay the propagation of the clock signal 302. In the embodiment shown in FIG. 3, the delay line 300 includes one or more AND gates, such as AND gates 304a, 304b, 304c and 304d, one or more NAND gates, such as NAND gate 306, and one or more buffers, such as buffers 308a, 308b and 308c, to delay the propagation of the clock signal 302 from the input 206 to the output 218 of the delay line 300. Other types of logic gates, buffers or delay lines may also be implemented within the scope of the disclosure. Moreover, although FIG. 3 illustrates a positive edge triggered flip-flop 220, such as a D flip-flop, other types of flip-flops may be implemented in other embodiments. For example, instead of positive edge triggering, other types of triggering such as negative edge triggering may be implemented.

In an embodiment, the delay line 300 and the flip-flop 220 in FIG. 3 are implemented to reduce the probability of invalid transitions in the error location decoder 228 as shown in FIG. 2. With a set amount of time delay provided by the delay line 300, the clock signal 302 reaches the flip-flop 220 after the syndrome is settled, and the syndrome is delivered by the flip-flop 220 to the error location decoder 228 as a delivered syndrome only after the syndrome is settled to avoid invalid transitions. In an embodiment, the delay line 300 is provided to mimic the worst delay of the syndrome generated by the syndrome generator 214. In an embodiment, the delay line 300 is created by mimicking the critical path of the circuit from the data and error check (databit_in) and (checkbit_in) inputs 202 and 204 to the output of the syndrome generator 214. The worst-case time delay of this critical path is the maximum time ($T_{I-S}$) needed for settling the syndromes.

In an embodiment, to ensure proper flip-flop operation, the delay line 300 may be designed such that the total time delay produced by the delay line 300 is slighter greater than the maximum time ($T_{I-S}$) needed for settling the syndromes even though the overall delay of the error detection and correction apparatus 200 is slightly increased. For example, in the embodiment shown in FIG. 3, the number of logic gates such as AND gates 304a, 304b, 304c and 304d and the NAND gate 306 may be implemented to mimic the maximum time ($T_{I-S}$) needed to settle the syndromes on the critical path from the syndrome inputs to the syndrome output, and the buffers such as buffers 308a, 308b and 308c may be added to produce additional time delay.

Figure 4:
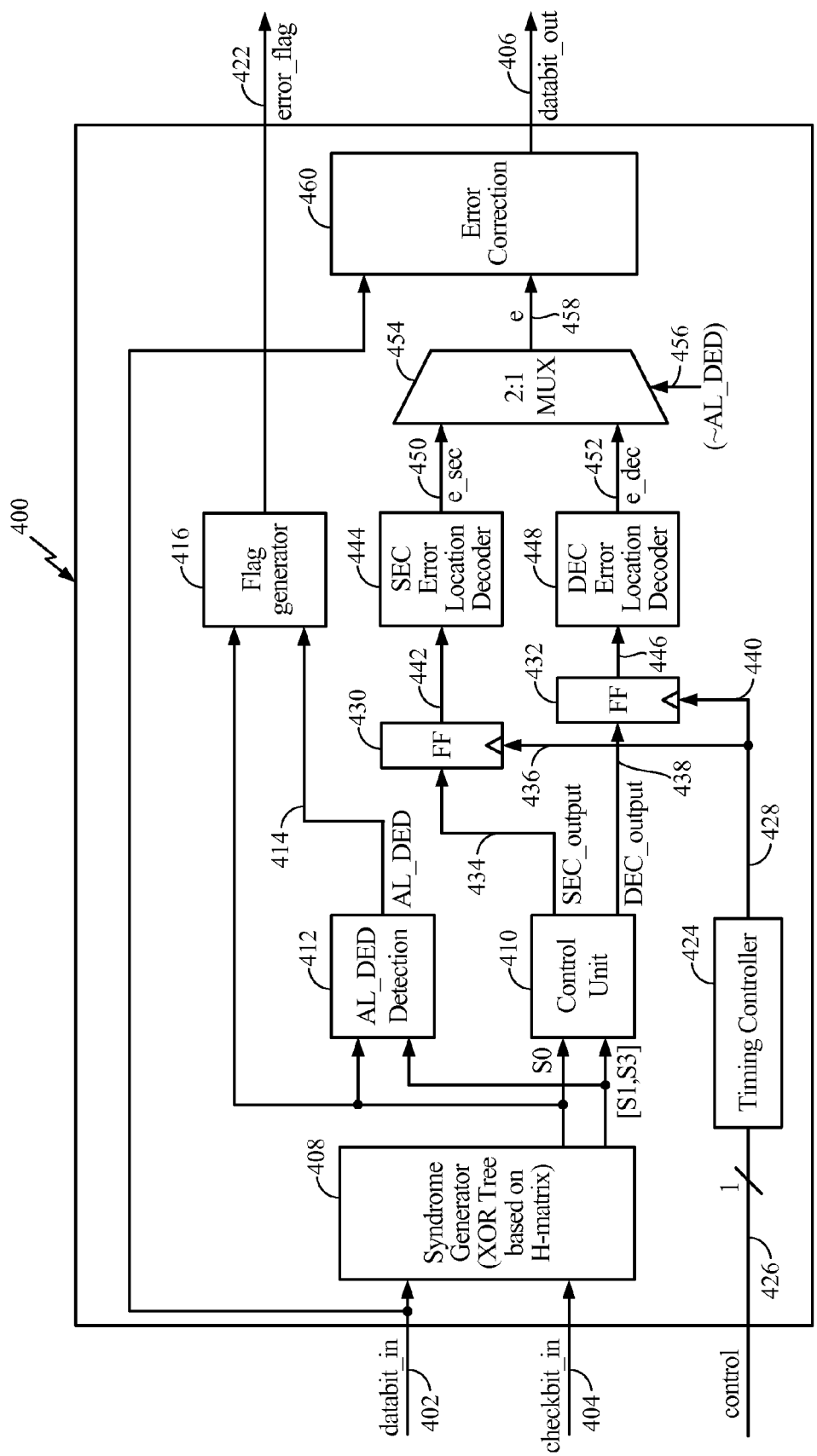
FIG. 4 is a block diagram illustrating yet another embodiment of an error detection and correction apparatus having flip-flops, a timing controller, separate single error correction (SEC) and double error correction (DEC) error location decoders, a multiplexer, and a flag generator.

FIG. 4 is a block diagram illustrating yet another embodiment of an error detection and correction apparatus having flip-flops, a timing controller, separate single error correction (SEC) and double error correction (DEC) error location decoders, a multiplexer, and a flag generator. In the embodiment illustrated in FIG. 4, the error detection and correction apparatus 400 has a data input (databit_in) 402, an error check input (checkbit_in) 404, and a corrected data output (databit_out) 406. In this embodiment, the error detection and correction apparatus 400 includes a syndrome generator 408 which is configured to receive the data input (databit_in) 402 and the error check input (checkbit_in) 404.

In an embodiment, the syndrome generator 408 is capable of generating a first vector signal output ($S_0$), a second vector signal output ($S_1$) and a third vector signal output ($S_3$) in response to the data input (databit_in) 402 and the error check input (checkbit_in) 404 in a similar manner to the syndrome generator 108 in the embodiment shown in FIG. 1 and described above. In an embodiment, the syndrome generator 408 comprises a parity-check matrix decoder, and the error check input (checkbit_in) 404 comprises a parity-check bit input. In an embodiment, the parity-check matrix decoder may comprise an XOR-tree based parity-check matrix decoder. For example, the syndrome generator 408 may be constructed by implementing any known ECC such as the BCH code.

In the embodiment illustrated in FIG. 4, the error detection and correction apparatus 400 also includes a controller 410 which is configured to receive the first vector signal output ($S_0$), the second vector signal output ($S_1$) and the third vector signal output ($S_3$) from the syndrome generator 408, and to generate a single error correction output (SEC_output) and a double error correction output (DEC_output) based on the three vector signals $S_0$, $S_1$ and $S_3$ from the syndrome generator 108. In an embodiment, the SEC_output and DEC_output may be generated in the same manner as described above with respect to FIG. 1.

In the embodiment illustrated in FIG. 4, the error detection and correction apparatus 400 further includes a double error detector 412 which has inputs coupled to receive the first vector signal output ($S_0$), the second vector signal output ($S_1$) and the third vector signal output ($S_3$) from the syndrome generator 108, and an output that generates a double error detection output (AL_DED) 414 based on at least two of the three vector signals $S_0$, $S_1$ and $S_3$ from the syndrome generator 408.

In an embodiment, the double error detection output (AL_DED) 414 from the double error detector 412 may be generated by the same equation described above with respect to FIG. 1 based on the second vector signal output ($S_1$) and the third vector signal output ($S_3$) received from the syndrome generator 108:

$$AL\_DED = S_1^3 + S_3$$

In an embodiment, a flag generator 416 is provided in the error detection and correction apparatus 400 as illustrated in FIG. 4 in a similar manner to the embodiment described above with respect to FIG. 1. Referring to FIG. 4, the flag generator 416 generates a two-bit error flag (error_flag) 422, which is output from the error detection and correction apparatus 400 as a two-bit indicator of zero error, single error, double error or triple error. In an embodiment, the two-bit error flag (error_flag) 422 may be generated to indicate the presence of zero, single, double or triple errors according to Table 1 described above with respect to FIG. 1.

Referring to FIG. 4, a timing controller 424 having a control input 426 which receives a clock signal and an output 428 which produces a time-delayed clock output is provided. In an embodiment, the timing controller 424 may comprise a delay line such as the delay line 300 as illustrated in FIG. 3 and described above. For example, such a delay line may comprise one or more logic gates, such as AND or NAND gates, or one or more buffers, or a combination of logic gates and buffers, as shown in FIG. 3. Referring to FIG. 4, the time-delayed clock output from the output 428 of the timing controller 424 is provided as toggle inputs for two flip-flops 430 and 432.

In the embodiment shown in FIG. 4, the first flip-flop 430 is provided which includes a data input 434 to receive the single error correction output (SEC_output) from the controller 410 and a toggle input 436 to receive the time-delayed clock output from the timing controller 424. In an embodiment, the first flip-flop 430 comprises a D flip-flop with positive edge triggering. Likewise, the second flip-flop 432 is provided which includes a data input 438 to receive the double error correction output (DEC_output) from the controller 410 and a toggle input 440 to receive the time-delayed clock output from the timing controller 424. In a further embodiment, the second flip-flop 432 may also comprise a D flip-flop with positive edge triggering. In alternate embodiments, other types of flip-flops may be implemented, and triggering of the flip-flops need not be positive edge triggering by clock signals.

In the embodiment shown in FIG. 4, the first flip-flop 430 outputs a delivered SEC_output 442 to a single error correction (SEC) error location decoder 444, while the second flip-flop 432 outputs a delivered DEC_output 446 to a double error correction (DEC) error location decoder 448. The SEC_output and the DEC_output may be generated by the controller 410 in the same manner as described above with respect to FIG. 1. The first and second flip-flops 430 and 432 are provided in the embodiment as shown in FIG. 4 to ensure that the SEC_output and DEC_output are delivered to the SEC error location decoder 444 and the DEC error location decoder 448, respectively, only after the syndrome is settled to avoid invalid transitions.

In an embodiment, the SEC error location decoder 444 and the DEC error location decoder 448 in FIG. 4 generate a single error location decoder output (e_sec) 450 and a double error location decoder output (e_dec) 452, respectively, in the same manner as described above with respect to FIG. 1. Referring to FIG. 4, a multiplexer 454 having a first input coupled to receive the single error location decoder output (e_sec) 450, a second input coupled to receive the double error location decoder output (e_dec) 452, and a control input 456. In an embodiment, the control input 456 is coupled to receive the logical complement of AL_DED in the same manner as described above with respect to FIG. 1. In an embodiment, the output (e) 458 of the multiplexer 454 is selected in the same manner as described above with respect to FIG. 1, according to the relationships described in Tables 2 and 3, for example.

In a further embodiment, an error corrector 460 is provided in the error detection and correction apparatus 400 of FIG. 4. In an embodiment, the error corrector has a data input coupled to receive the input data (databit_in), an error vector input coupled to the error vector output (e) 458 of the multiplexer 454, and an output 406 which outputs corrected data (databit_out).

Figure 5:
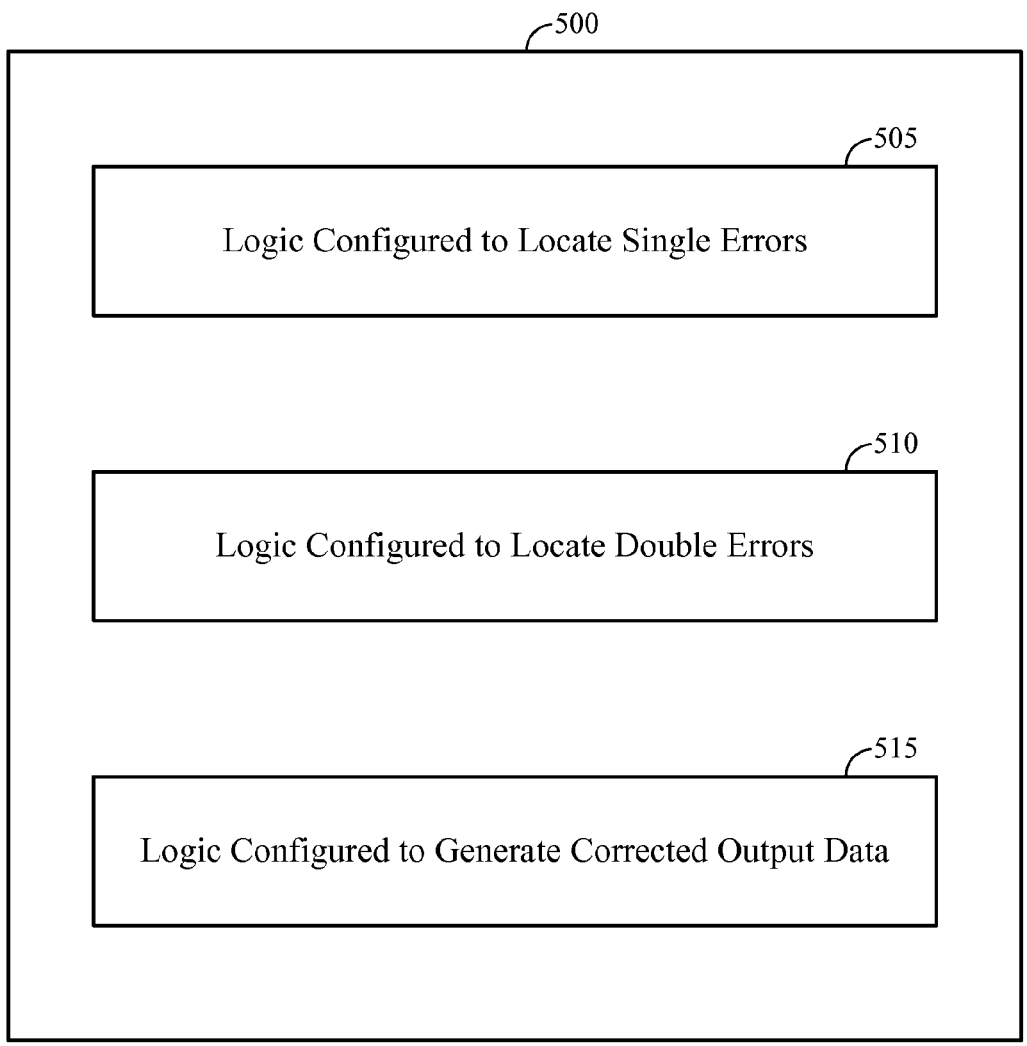
FIG. 5 is a block diagram illustrating an embodiment of an error detection and correction apparatus with logic configured to perform error detection and correction functions.

FIG. 5 is a simplified block diagram illustrating an embodiment of an error detection and correction apparatus with logic configured to perform error detection and correction functions. In the embodiment illustrated in FIG. 5, the error detection and correction apparatus 500 includes logic configured to locate single errors in block 505, logic configured to locate double errors 510, and logic configured to generate corrected output data 515. Each of the logic configured to locate single errors, logic configured to locate double errors, and logic configured to generate corrected output data as illustrated in blocks 505, 510 and 515 may include one or more elements in various embodiments of the error detection and correction apparatus described above with respect to FIGS. 1-4.

Figure 6:
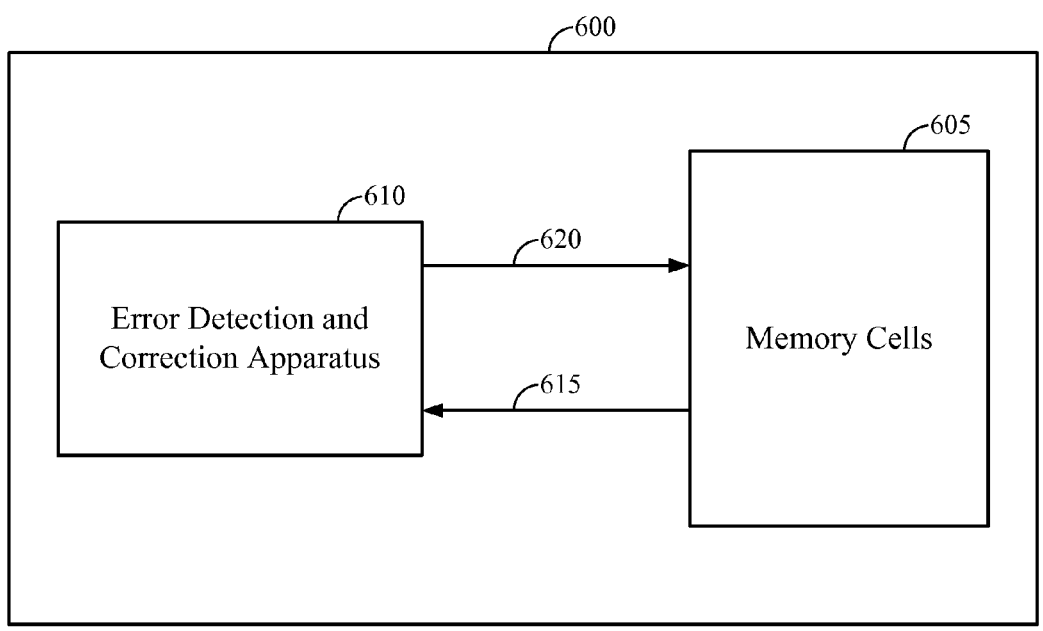
FIG. 6 is a block diagram illustrating an embodiment of a memory device in which error detection and correction apparatus may be implemented.

FIG. 6 is a block diagram illustrating an embodiment of a memory device in which error detection and correction apparatus may be implemented. In the embodiment illustrated in FIG. 6, a memory 600 includes memory cells 605 and an error detection and correction apparatus 610. The error detection and correction apparatus 610 may be integrated on the same chip as memory cells 605, or be provided on a separate chip. As shown in FIG. 6, raw data from the memory cells may be transmitted along arrow 615 to the error detection and correction apparatus 610 for error detection and correction, and corrected data from the error detection and correction apparatus 610 may be transmitted along arrow 620 back to the memory cells 605. The error detection and correction apparatus 610 may include any of the various embodiments described above with respect to FIGS. 1-4.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall apparatus. Skilled artisans may implement the described functionality in varying ways for each particular application, but such implementation decisions should not be interpreted as causing a departure from the scope of the disclosure.

The methods, sequences or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the disclosure can include a computer readable media embodying a method for error detection and correction. Accordingly, the disclosure is not limited to illustrated examples and any means for performing the functionality described herein are included in embodiments of the disclosure.

While the foregoing disclosure shows illustrative embodiments, it should be noted that various changes and modifications could be made herein without departing from the scope of the appended claims. The functions, steps or actions of the method claims in accordance with embodiments described herein need not be performed in any particular order unless expressly stated otherwise. Furthermore, although elements may be described or claimed in the singular, the plural is contemplated unless limitation to the singular is explicitly stated.

What is claimed is:

1. An error detection and correction apparatus, comprising:
   a single error location decoder configured to locate single errors in input data;
   a double error location decoder configured to locate double errors in the input data;
   a controller configured to determine whether a particular data input is predicted to have a single error or a double error, to select one of the single error location decoder and the double error location decoder to perform error location on the particular data input based on the error prediction, and to de-activate the non-selected error location decoder; and
   an error corrector coupled to the single error location decoder and the double error location decoder to generate corrected output data.

2. The apparatus of claim 1, further comprising:
   a syndrome generator configured to receive the input data and to generate a first vector signal output and one or more additional vector signal outputs based on the input data,
   wherein the controller is further configured to receive the first vector signal output and the one or more additional vector signal outputs, and to generate a single error correction output and a double error correction output based on the first vector signal output and the one or more additional vector signal outputs,
   wherein the single error location decoder is configured to receive the single error correction output and to generate a single error location decoder output; and
   wherein the double error location decoder is configured to receive the double error correction output and to output a double error location decoder output.

3. The apparatus of claim 2, wherein the syndrome generator comprises a parity-check matrix decoder.

4. The apparatus of claim 3, wherein the parity-check matrix decoder comprises an XOR-tree based parity-check matrix decoder.

5. The apparatus of claim 2, further comprising a double error detector configured to receive the first vector signal output and the one or more additional vector signal outputs from the syndrome generator.

6. The apparatus of claim 5, wherein the double error detector is configured to generate a double error detection output based on two or more of the first vector signal output and the one or more additional vector signal outputs.

7. The apparatus of claim 6, further comprising a flag generator configured to receive the double error detection output from the double error detector and the first vector signal output from the syndrome generator, and to generate an error flag based on the double error detection output and the first vector signal output.

8. The apparatus of claim 6, further comprising a multiplexer, comprising:
   a first input coupled to the single error location decoder output; and
   a second input coupled to the double error location decoder output.

9. The apparatus of claim 8, wherein the multiplexer further comprises:
   a control input configured to receive the double error detection output; and
   an output configured to output either the single error location decoder output or the double error location decoder output based on the control input.

10. The apparatus of claim 9, further comprising an error corrector, comprising:
    an input configured to receive the input data;
    an error location decoder input coupled to the output of the multiplexer; and
    an output configured to output the corrected output data based on the input data and the error location decoder input.

11. The apparatus of claim 10, wherein the first flip-flop comprises a first positive edge triggered flip-flop, and wherein the second flip-flop comprises a second positive edge triggered flip-flop.

12. The apparatus of claim 2, further comprising:
a timing controller having a control input and a control output;
a first flip-flop comprising an input coupled to receive the single error correction output, a toggle input coupled to the control output of the timing controller, and an output configured to output a first delivered syndrome output; and
a second flip-flop comprising an input coupled to receive the double error correction output, a toggle input coupled to the control output of the timing controller, and an output configured to output a second delivered syndrome output.

13. The apparatus of claim 12, wherein the timing controller comprises a delay unit.

14. The apparatus of claim 13, wherein the delay unit comprises one or more logic gates.

15. The apparatus of claim 14, wherein the delay unit further comprises one or more buffers.

16. An error detection and correction apparatus, comprising:
means for single error location decoding to locate single errors in input data;
means for double error location decoding to locate double errors in the input data;
means for determining whether a particular data input is predicted to have a single error or a double error;
means for selecting one of the single error location decoder and the double error location decoder to perform error location on the particular data input based on the error prediction;
means for de-activating the non-selected error location decoder; and
means for correcting errors to generate corrected output data based on the single errors located by the means for single error location decoding and the double errors located by the means for double error location decoding.

17. The apparatus of claim 16, further comprising:
means for generating a syndrome, wherein the means for generating the syndrome is configured to receive the input data and to output a first vector signal output and one or more additional vector signal outputs based on the input data; and
means for generating a single error correction output and a double error correction output, wherein the means for generating the single error correction output and the double error correction output is configured to receive the first vector signal output and the one or more additional vector signal outputs, and to generate a single error correction output and a double error correction output based on the first vector signal output and the one or more additional vector signal outputs,
wherein the means for single error location decoding is configured to receive the single error correction output and to output a single error location decoder output; and
wherein the means for double error location decoding is configured to receive the double error correction output and to output a double error location decoder output.

18. The apparatus of claim 17, wherein means for generating the syndrome comprises a parity-check matrix decoder.

19. The apparatus of claim 17, further comprising means for detecting double errors based on the first vector signal output and the one or more additional vector signal outputs to generate a double error detection output.

20. The apparatus of claim 19, further comprising means for generating an error flag based on the double error detection output and the first vector signal output.

21. The apparatus of claim 20, further comprising means for multiplexing, comprising:
a first input coupled to the single error location decoder output;
a second input coupled to the double error location decoder output;
a control input configured to receive the double error detection output; and
an output configured to output either the single error location decoder output or the double error location decoder output based on the control input.

22. The apparatus of claim 21, further comprising means for correcting errors, comprising:
a data input configured to receive the input data;
an error location decoder input coupled to the output of the means for multiplexing; and
an output configured to output corrected data based on the data input and the error location decoder input.

23. The apparatus of claim 17, further comprising:
means for controlling timing, the means for controlling timing having a control input and a control output;
a first flip-flop comprising an input coupled to receive the single error correction output, a toggle input coupled to the control output of the means for controlling timing, and an output configured to output a first delivered syndrome output; and
a second flip-flop comprising an input coupled to receive the double error correction output, a toggle input coupled to the control output of the means for controlling timing, and an output configured to output a second delivered syndrome output.

24. The apparatus of claim 23, wherein the first delivered syndrome output is delivered to the means for single error location decoding, and wherein the second delivered syndrome output is delivered to the means for double error location decoding.

25. A memory, comprising:
a memory cell; and
an error detection and correction apparatus coupled to receive input data from the memory cell and to transmit corrected output data to the memory cell, the error detection and correction apparatus comprising:
a single error location decoder configured to locate single errors in input data;
a double error location decoder configured to locate double errors in the input data;
a controller configured to determine whether a particular data input is predicted to have a single error or a double error, to select one of the single error location decoder and the double error location decoder to perform error location on the particular data input based on the error prediction, and to de-activate the non-selected error location decoder; and
an error corrector coupled to the single error location decoder and the double error location decoder to generate corrected output data.

26. The memory of claim 25, wherein the error detection and correction apparatus further comprises:
a syndrome generator configured to receive the input data and to generate a first vector signal output and one or more additional vector signal outputs based on the input data; and
wherein the controller is further configured to receive the first vector signal output and the one or more additional vector signal outputs, and to generate a single error correction output and a double error correction output based on the first vector signal output and the one or more additional vector signal outputs, wherein the single error location decoder is configured to receive the single error correction output and to generate a single error location decoder output; and wherein the double error location decoder is configured to receive the double error correction output and to output a double error location decoder output.

27. The memory of claim 26, wherein the error detection and correction apparatus further comprises:

a timing controller having a control input and a control output;

a first flip-flop comprising an input coupled to receive the single error correction output, a toggle input coupled to the control output of the timing controller, and an output configured to output a first delivered syndrome output; and a second flip-flop comprising an input coupled to receive the double error correction output, a toggle input coupled to the control output of the timing controller, and an output configured to output a second delivered syndrome output.

* * * * *